(12) United States Patent
Shim

(10) Patent No.: US 9,424,942 B2
(45) Date of Patent: Aug. 23, 2016

(54) REDUCED TIMING AND READ VERIFYING OPERATION FOR NON-VOLATILE MEMORY DEVICE

(71) Applicant: Dong-Kyo Shim, Seoul (KR)

(72) Inventor: Dong-Kyo Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/639,341

(22) Filed: Mar. 5, 2015

(65) Prior Publication Data

US 2016/0005490 A1    Jan. 7, 2016

(30) Foreign Application Priority Data

Jul. 3, 2014   (KR) ........................ 10-2014-0082991

(51) Int. Cl.
| | |
|---|---|
| *G11C 16/26* | (2006.01) |
| *G11C 16/10* | (2006.01) |
| *G11C 16/24* | (2006.01) |
| *G11C 11/56* | (2006.01) |
| *G11C 16/34* | (2006.01) |
| *G11C 29/04* | (2006.01) |

(52) U.S. Cl.
CPC ............ *G11C 16/26* (2013.01); *G11C 11/5628* (2013.01); *G11C 16/10* (2013.01); *G11C 16/24* (2013.01); *G11C 16/3454* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 7,046,554 B2 | 5/2006 | Lee | |
| 7,372,743 B2 | 5/2008 | Yano et al. | |
| 7,391,649 B2 | 6/2008 | Kang et al. | |
| 7,535,775 B2 | 5/2009 | Kang et al. | |
| 7,826,276 B2 | 11/2010 | Park et al. | |
| 7,872,925 B2 | 1/2011 | Lee et al. | |
| 7,903,466 B2 | 3/2011 | Wang et al. | |
| 8,228,729 B2 | 7/2012 | Liu et al. | |
| 8,625,330 B2 | 1/2014 | Kim | |
| 2013/0132644 A1 | 5/2013 | Choi et al. | |
| 2013/0308393 A1* | 11/2013 | Youn | G11C 16/3481 365/189.05 |
| 2014/0056069 A1* | 2/2014 | Park | G11C 16/0483 365/185.05 |
| 2015/0078097 A1* | 3/2015 | Yano | G11C 16/14 365/185.25 |
| 2015/0221380 A1* | 8/2015 | Lee | G11C 16/10 365/185.11 |
| 2015/0248930 A1* | 9/2015 | Lee | G11C 29/04 365/185.03 |

FOREIGN PATENT DOCUMENTS

| | | |
|---|---|---|
| KR | 100769802 | 10/2007 |
| KR | 20130043469 | 4/2013 |

* cited by examiner

*Primary Examiner* — Son Dinh
*Assistant Examiner* — Sultana Begum
(74) *Attorney, Agent, or Firm* — Volentine & Whitt, PLLC

(57) ABSTRACT

A non-volatile memory device includes a memory cell array having a plurality of memory cells programmable into one of multiple logic states, the plurality of memory cells disposed at intersections of a plurality of wordlines and a plurality of bitlines, and a plurality of page buffers respectively connected to the plurality of bitlines and performing verifying read operations on the plurality of memory cells. The verifying read operations are performed on a first memory cell having a target state and a second memory cell having a lower state than the target state.

19 Claims, 15 Drawing Sheets

| Page | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| 4P | 1 | 0 | 0 | 0 | 0 | 1 | 0 | 0 | 0 | 1 | 1 | 1 | 0 | 1 | 1 | 1 |
| 3P | 1 | 0 | 0 | 0 | 1 | 0 | 0 | 1 | 1 | 0 | 0 | 1 | 1 | 0 | 1 | 1 |
| 2P | 1 | 0 | 0 | 1 | 0 | 0 | 1 | 1 | 0 | 1 | 0 | 0 | 1 | 1 | 0 | 1 |
| 1P | 1 | 0 | 1 | 0 | 0 | 0 | 1 | 0 | 1 | 0 | 1 | 0 | 1 | 1 | 1 | 0 |

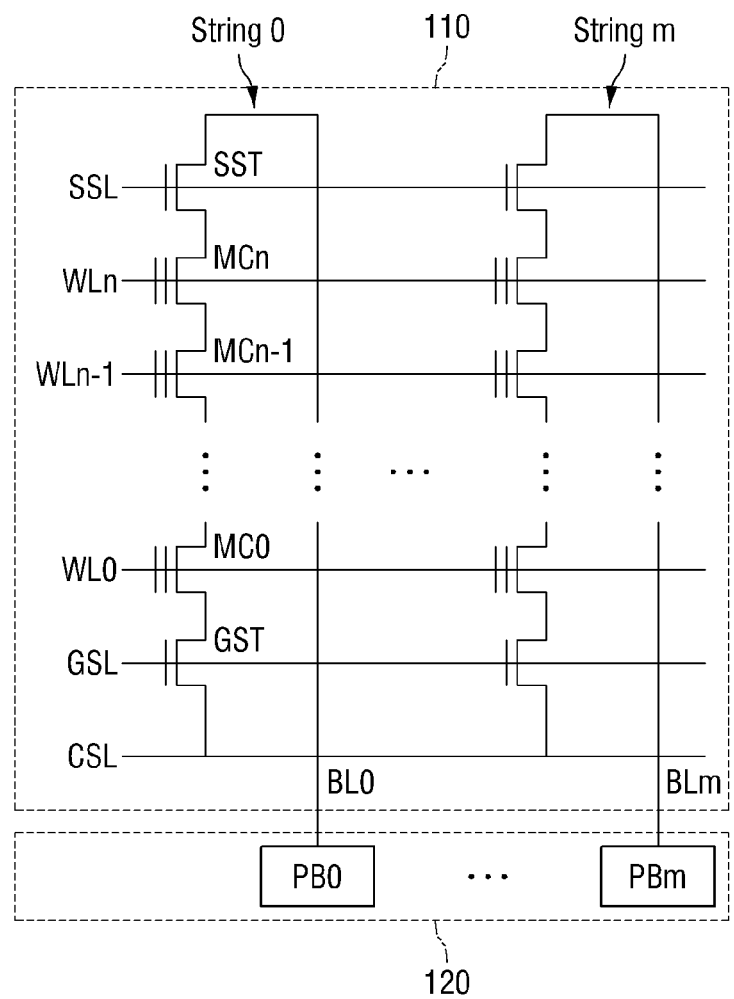

FIG. 5

| Page | E | P1 | P2 | P3 | P4 | P5 | P6 | P7 | P8 | P9 | P10 | P11 | P12 | P13 | P14 | P15 |
|------|---|----|----|----|----|----|----|----|----|----|-----|-----|-----|-----|-----|-----|
| 4P | 1 | 0 | 0 | 0 | 0 | 1 | 0 | 0 | 0 | 1 | 1 | 1 | 0 | 1 | 1 | 1 |
| 3P | 1 | 0 | 0 | 0 | 1 | 0 | 0 | 1 | 1 | 0 | 0 | 1 | 1 | 0 | 1 | 1 |
| 2P | 1 | 0 | 0 | 1 | 0 | 0 | 1 | 1 | 0 | 1 | 0 | 0 | 1 | 1 | 0 | 1 |
| 1P | 1 | 0 | 1 | 0 | 0 | 0 | 1 | 0 | 1 | 0 | 1 | 0 | 1 | 1 | 1 | 0 |

FIG. 6

| Page | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| 4P | 1 | 0 | 0 | 0 | 0 | 1 | 0 | 0 | 0 | 1 | 1 | 1 | 0 | 1 | 1 | 1 |
| 3P | 1 | 0 | 0 | 0 | 1 | 0 | 0 | 1 | 1 | 0 | 0 | 1 | 1 | 0 | 1 | 1 |
| 2P | 1 | 0 | 0 | 1 | 0 | 0 | 1 | 1 | 0 | 1 | 0 | 0 | 1 | 1 | 0 | 1 |
| 1P | 1 | 0 | 1 | 0 | 0 | 0 | 1 | 0 | 1 | 0 | 1 | 0 | 1 | 1 | 1 | 0 |

FIG. 7

| Page | E | P1 | P2 | P3 | P4 | P5 | P6 | P7 | P8 | P9 | P10 | P11 | P12 | P13 | P14 | P15 |
|------|---|----|----|----|----|----|----|----|----|----|-----|-----|-----|-----|-----|-----|
| 4P | 1 | 0 | 0 | 0 | 0 | 1 | 0 | 0 | 0 | 1 | 1 | 1 | 0 | 1 | 1 | 1 |
| 3P | 1 | 0 | 0 | 0 | 1 | 0 | 0 | 1 | 1 | 0 | 0 | 1 | 1 | 0 | 1 | 1 |
| 2P | 1 | 0 | 0 | 1 | 0 | 0 | 1 | 1 | 0 | 1 | 0 | 0 | 1 | 1 | 0 | 1 |
| 1P | 1 | 0 | 1 | 0 | 0 | 0 | 1 | 0 | 1 | 0 | 1 | 0 | 1 | 1 | 1 | 0 |

1000

3000

REDUCED TIMING AND READ VERIFYING OPERATION FOR NON-VOLATILE MEMORY DEVICE

CROSS-REFERENCE TO RELATED APPLICATION

A claim of priority is made to Korean Patent Application No. 10-2014-0082991 filed on Jul. 3, 2014 in the Korean Intellectual Property Office, and all the benefits accruing therefrom under 35 U.S.C. 119, the contents of which in its entirety are herein incorporated by reference.

BACKGROUND

The present inventive concept relates to a non-volatile memory device and an operating method of the same.

Semiconductor memory devices are generally categorized as either volatile memory devices or non-volatile memory devices.

Volatile memory devices lose stored data when disconnected from power, and examples thereof include a static random access memory (SRAM), a dynamic random access memory (DRAM), and a synchronous dynamic random access memory (SDRAM). In contrast, non-volatile memory devices retain stored data even when disconnected from power, and examples thereof include a read only memory (ROM), a programmable read only memory (PROM), an erasable programmable read only memory (EPROM), an electrically erasable programmable read only memory (EEPROM), a flash memory, a phase-change random access memory (PRAM), a resistive read only memory (RRAM), a magnetoresistive random access memory (MRAM), and a ferroelectric random access memory (FRAM).

SUMMARY

According to an aspect of the present inventive concept, there is provided a non-volatile memory device including a memory cell array having a plurality of memory cells programmable into one of multiple logic states, the plurality of memory cells disposed at intersections of a plurality of wordlines and a plurality of bitlines, and a plurality of page buffers respectively connected to the plurality of bitlines and performing verifying read operations on the plurality of memory cells, wherein the verifying read operations are performed on a first memory cell having a target state and a second memory cell having a lower state than the target state.

According to another aspect of the present inventive concept, there is provided a non-volatile memory device including a memory cell array having a plurality of memory cells programmable into one of multiple logic states, the plurality of memory cells disposed at intersections of a plurality of wordlines and a plurality of bitlines, and a plurality of page buffers respectively connected to the plurality of bitlines and performing verifying read operations on the plurality of memory cells, wherein the plurality of page buffers arrange and memorize data such that the number of low level values among level values representing program states of one of the plurality of memory cells is equal to or smaller than the number of low level values among level values representing program states of another memory cell.

According to yet another aspect of the present inventive concept, there is provided an operating method for a non-volatile memory device. The operating method included supplying a program voltage to wordlines during a program period to program a plurality of memory cells to one of a plurality of logic states, and performing verifying read operations on the plurality of memory cells with a verify voltage provided to wordlines during a verifying read period and a precharge voltage supplied to bitlines. The verifying read operations are performed on the first memory cell having a target state and the second memory cell having lower states than the target state.

BRIEF DESCRIPTION OF THE DRAWINGS

The above and other features and advantages of the present inventive concept will become more apparent by describing in detail preferred embodiments thereof with reference to the attached drawings in which:

FIG. 2 is a block diagram specifically illustrating examples of a memory cell array and a page buffer shown in FIG. 1;

FIG. 5 illustrates a table showing example level values indicating states of memory cells storing 4-bit data;

FIG. 6 illustrates a table for explaining a case in which a target state is P2;

FIG. 7 illustrates a table for explaining a case in which a target state is P6;

DETAILED DESCRIPTION OF THE EMBODIMENTS

Figure 1:
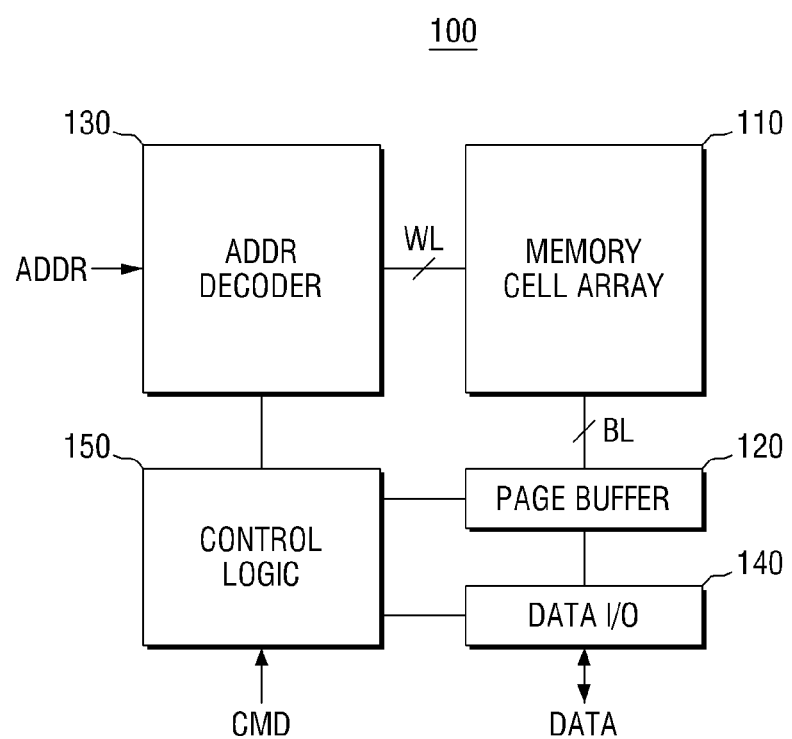
FIG. 1 is a block diagram illustrating a non-volatile memory device according to an embodiment of the present inventive concept.

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will filly convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The present inventive concept will be described with reference to perspective views, cross-sectional views, and/or plan views, in which preferred embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Hereinafter, embodiments of the present inventive concept will be described with regard to a NAND flash memory device among non-volatile memory devices, but the present inventive concept is not limited to the flash memory device.

FIG. 1 is a block diagram illustrating a non-volatile memory device according to an embodiment of the present inventive concept.

Referring to FIG. 1, the non-volatile memory device 100 according to an embodiment of the present inventive concept includes a memory cell array 110, a page buffer 120, an address decoder (ADD DECODER) 130, a data input/output (I/O) 140, and a control logic 150.

The memory cell array 110 includes a plurality of wordlines WL and a plurality of bitlines BL. A plurality of memory cells are disposed at intersections of the plurality of wordlines WL and the plurality of bitlines BL. One of a plurality of logic states may be programmed to the plurality of memory cells.

For example, the memory cell array 110 may have a single layer array structure or a multi layer array structure.

The memory cell array 110 may be connected to the address decoder 130 through the plurality of wordlines WL. In addition, the memory cell array 110 may be connected to the page buffer 120 through the plurality of bitlines BL.

The page buffer 120 stores data to be programmed to the memory cell array 110 and/or data to be read from the memory cell array 110. The page buffer 120 may function as a write driver or a sense amplifier according to the operation of the non-volatile memory device 100.

For example, during a program operation of the non-volatile memory device 100, the page buffer 120 may function as a write driver. During a read operation of the non-volatile memory device 100, the page buffer 120 may function as a sense amplifier.

The page buffer 120 may perform a read operation in response to a control signal of the control logic 150. The page buffer 120 may supply a precharge voltage to the sensing node SO and the bitlines BL and senses a change in the voltage level of the sensing node SO, thereby discriminating a threshold voltage of a memory cell.

The address decoder 130 receives an address ADDR from the outside (host or memory controller) and selects a wordline WL of the memory cell array 110 corresponding to the address ADDR.

The address decoder 130 may receive a voltage for programming a memory cell from the control logic 150 and may supply the voltage to the selected wordline WL and/or a non-selected wordline WL.

The data I/O 140 may exchange data with respect to the page buffer 120 in response to a control signal of the control logic 150. For example, during a program operation of the non-volatile memory device 100, the data I/O 140 may supply externally applied data to the page buffer 120. In addition, during a read operation of the non-volatile memory device 100, the data I/O 140 may supply the data received from the page buffer 120 to the outside.

The control logic 150 may control the overall operation of the non-volatile memory device 100. The control logic 150 may control the page buffer 120, the address decoder 130, and the data I/O 140 in response to an externally applied command CMD.

The control logic 150, including a voltage generator, may generate voltages for program, erase and read operations of the non-volatile memory device 100.

Although not clearly shown in FIG. 1, the non-volatile memory device 100 according to the embodiment of the present inventive concept may further include well-known components in addition to the aforementioned components.

FIG. 2 is a block diagram specifically illustrating examples of a memory cell array and a page buffer shown in FIG. 1.

Referring to FIG. 2, the memory cell array 110 may include a plurality of NAND strings string 0 to string m. The plurality of NAND strings string 0 to string m may constitute a memory block, and a plurality of memory blocks may constitute the memory cell array 110.

The plurality of NAND strings string 0 to string m may correspond to the plurality of bitlines BL0 to BLm, respectively. Each of the NAND strings may include a string select transistor SST, a plurality of memory cells MC0 to MCn, and a ground select transistor GST.

A drain of the string select transistor SST may be a connected to a corresponding bitline BL and a source of the ground select transistor GST may be a connected to a common source line CSL. The plurality of memory cells MC0 to MCn may be connected to each other in series between the string select transistors SST and the ground select transistors GST.

The memory cells MC0 to MCn arranged on the same row may commonly be connected to the corresponding wordlines WL0 to WLn. The string select transistors SST arranged on the same row may commonly be connected to a string select line SSL. The ground select transistors GST arranged on the same row may commonly be connected to a ground select line GSL.

The memory cells MC0 to MCn may be controlled by voltages supplied to floating gates through the wordlines WL0 to WLn. Each of the memory cells MC0 to MCn may be programmed into one of a plurality of logic states. That is to say, each of the memory cells MC0 to MCn may be configured by a multi level cell (MLC) storing N-bit data, where N is a natural number of 2 or greater.

In order to program the memory cells MC0 to MCn into one of a plurality of logic states, a plurality of verify voltages may be used. The respective memory cells MC0 to MCn may be programmed using different verify voltages according to logic states.

The page buffer 120 may include a plurality of page buffers PB0 to PBm. The plurality of page buffers PB0 to PBm may be connected to the plurality of bitlines BL0 to BLm, which may be referred to as an all-bit-line (ABL) architecture.

In the ABL architecture, during program and read operations of the non-volatile memory device 100, all bitlines BL0 to BLm may be simultaneously selected. That is to say, the respective page buffers PB0 to PBm may simultaneously program all memory cells arranged on the same row.

In addition, during a program operation of a memory cell, the respective page buffers PB0 to PBm may perform verifying read operations of memory cells arranged on the corresponding bitlines BL0 to BLm.

Figure 3A:
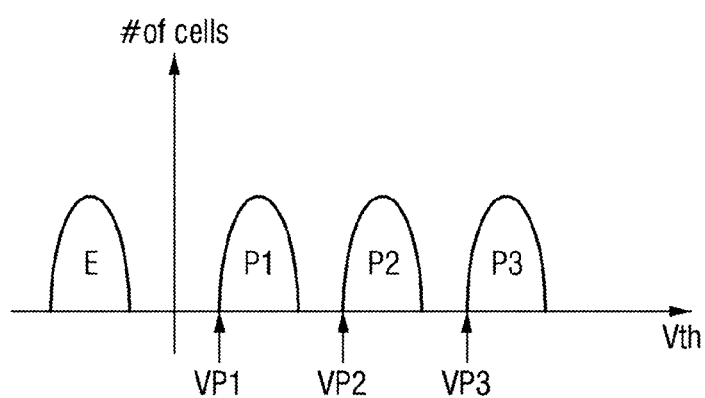
FIGS. 3A and 3B are diagrams illustrating examples of threshold voltage distributions of a memory cell shown in FIG. 2.
Figure 3B:
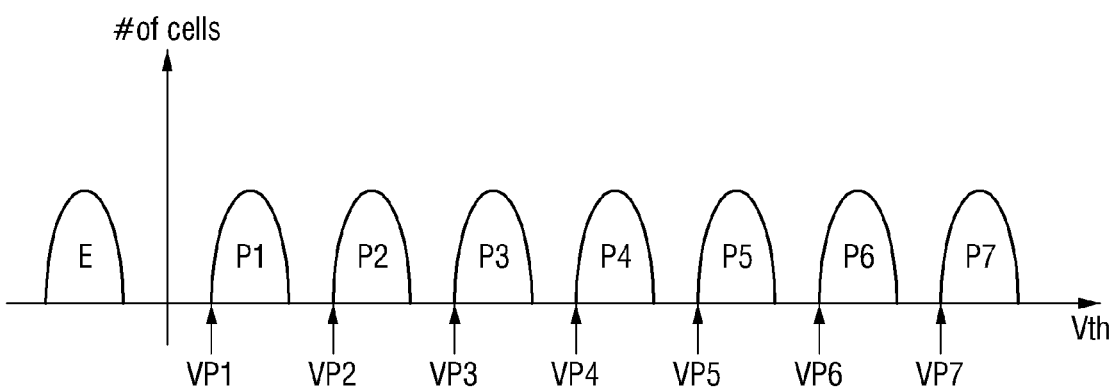

FIGS. 3A and 3B are diagrams illustrating threshold voltage distributions of a memory cell shown in FIG. 2.

In FIGS. 3A and 3B, the horizontal axis indicates voltages and the vertical axis indicates the number of memory cells.

Referring to FIG. 3A, as an example, the memory cells MC0 to MCn shown in FIG. 1 may be programmed into one of four logic states (including an erase state). That is to say, each of the memory cells MC0 to MCn may be configured by an MLC storing 2-bit data.

In FIG. 3A, a logic state "E" indicates erased states of the memory cells MC0 to MCn, and logic states "P1," "P2" and "P3" indicate programmed states of the memory cells MC0 to MCn. The memory cells MC0 to MCn may have four threshold voltage distributions corresponding four logic states. The logic states of the memory cells MC0 to MCn may be discriminated by a plurality of verify voltages VP1, VP2 and VP3.

Program operations of MLC storing 2-bit data may be sequentially performed. In an example, a program operation of the least significant bit (LSB) may first be performed and a program operation of the most significant bit (MSB) may then be performed.

Referring to FIG. 3B, as an example, the memory cells MC0 to MCn shown in FIG. 1 may be programmed into one of eight logic states (including an erase state). That is to say, each of the memory cells MC0 to MCn may be configured by an MLC storing 3-bit data. Such memory cells MC0 to MCn may be referred to as triple level cells (TLCs).

In FIG. 3B, a logic state "E" indicates erased states of the memory cells MC0 to MCn, and logic states "P1," "P2," "P3," "P4," "P5," "P6" and "P7" indicate programmed states of the memory cells MC0 to MCn. The memory cells MC0 to MCn may have eight threshold voltage (Vth) distributions corresponding eight logic states. The logic states of the memory cells MC0 to MCn may be discriminated by a plurality of verify voltages VP1, VP2, VP3, VP4, VP5, VP6, and VP7.

Program operations of MLC storing 3-bit data may be sequentially performed. In an example, a program operation of the least significant bit (LSB) may first be performed, program operations of central significant bits (CSBs) may be performed, and a program operation of the most significant bit (MSB) may then be performed.

In FIGS. 3A and 3B, threshold voltage distributions of MLCs storing 2- to 3-bit data are exemplified, but aspects of the present inventive concept are not limited thereto. The threshold voltage distributions shown in FIGS. 3A to 3B are modified in various manners.

In addition, as described above, the memory cells MC0 to MCn shown in FIG. 2 may be configured by MLCs storing multi-bit data, including 2-bit, 4-bit, 8-bit, or 16-bit data.

Hereinafter, a case where the memory cells MC0 to MCn shown in FIG. 2 is configured by MLCs storing 4-bit data will be described by way of example.

Figure 4:
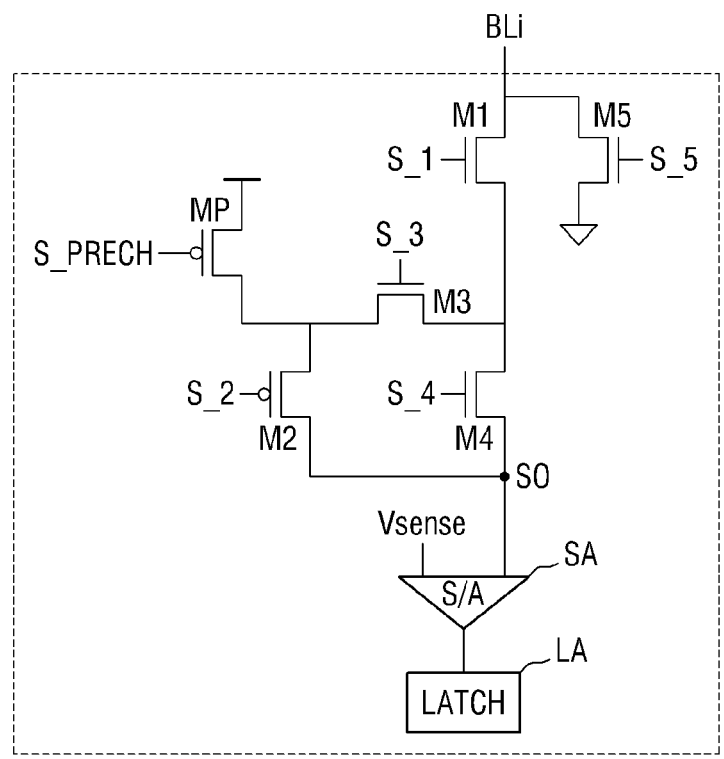
FIG. 4 is a circuit diagram illustrating a configuration of a page buffer according to an embodiment of the present inventive concept.

FIG. 4 is a circuit diagram illustrating a configuration of a page buffer according to an embodiment of the present inventive concept, FIG. 5 illustrates a table showing level values indicating states of memory cells storing 4-bit data, FIG. 6 illustrates a table for explaining a case in which a target state is P2 and FIG. 7 illustrates a table for explaining a case in which a target state is P6.

Referring to FIG. 4, the page buffer 121 may include a precharge transistor MP for performing a precharge operation, a plurality of transistors M1 to M5 for performing sensing operations, a sense amplifier SA for sensing a voltage of the sensing node SO, and a latch circuit LA for controlling the plurality of transistors M1 to M5. As an example, the precharge transistor MP and the second transistor M2 are PMOS transistors, and the first transistor and third to fifth transistors may be NMOS transistors.

The operation of a page buffer according to an embodiment of the present inventive concept will now be described with reference to FIGS. 5 to 7.

The page buffer 120 performs verifying read operations on the memory cells MC0 to MCn. The verifying read operations are performed on a first memory cell having a target state and a second memory cell having a lower state than the target state.

Here, the page buffer 120 arranges and memorizes data such that the number of low level values (e.g., 0) among level values representing program states of one among the memory cells MC0 to MCn is equal to or smaller than the number of low level values (e.g., 0) among level values representing program states of another among the memory cells MC0 to MCn.

That is to say, referring to FIG. 5, a logic state "E" indicates erased states of the memory cells MC0 to MCn, and logic states "P1, P2, P3, P4, P5, P6, P7, P8, P9, P10, P11, P12, P13, P14, and P15" indicate program states of the memory cells MC0 to MCn. The program states gradually become upper states in an ascending order from P1 to P15, P1 includes 4 low level values, each of P2 to P5 includes 3 low level values, each of P6 to P11 includes 2 low level values, and each of P12 to P15 includes one low level value.

If the page buffer 120 arranges and memorizes logic states from lower states to upper states in the above-described manner, the number of data transfer operations for selecting a particular state can be advantageously reduced during a selective verifying read operation.

That is to say, if the page buffer 120 selects only the low level values included in the target state with conditions of AND functions, memory cells having the selected state may be simultaneously precharged, and the number of data transfer operations for selecting a particular state may be reduced.

Referring to FIG. 6, when the target state is P2, verifying read operations are performed on the memory cells MC0 to MCn. When the target state is P2, low level values are memorized in 2P to 4P page buffers and states of low level values memorized in the 2P to 4P page buffers are P1 and P2. Thus, precharge operations are also performed on the memory cells MC0 to MCn having the state P1 lower than P2 as well.

Referring to FIG. 7, when the target state is P6, verifying read operations are performed on the memory cells MC0 to MCn. When the target state is P6, low level values are memorized in 3P and 4P page buffers and states of low level values memorized in the 2P to 4P page buffers are P1 to P3 and P6. Thus, precharge operations are also performed on the memory cells MC0 to MCn having the states P1 to P3 lower than P6 as well.

Referring to FIGS. 6 and 7, when a precharge operation is to be performed on a memory cell having a target state, precharge operations are also performed on all of the memory cells MC0 to MCn (see FIG. 6) having lower states than the target state or some of the memory cells MC0 to MCn (see FIG. 7) as well.

Here, when precharge operations are performed on the memory cells having lower states than the target state, the memory cell having the target state and the memory cells having lower states than the target state are simultaneously precharged.

In addition, when precharge operations are performed on the memory cells having lower states than the target state, the memory cells having lower states than the target state may be limited to memory cells determined as on cells based on the result of the verifying read operation performed at corresponding verify voltage levels.

That is to say, referring to FIG. 6, if memory cells having the state P1 are determined as off-cells in the verifying read operation VR1 performed on the memory cells, the verifying read operation VR1 is determined as being successful (pass), and precharge operations may also be performed on the memory cells determined as off-cells in the verifying read operation VR1 among the memory cells having the state P1 when a verifying read operation VR2 is performed on the memory cells having the state P2.

Referring to FIG. 7, the target state and the lower state may be non-contiguous states. That is to say, except for a case where the target state is P2, the precharged memory cells are in non-contiguous states, like in the non-volatile memory device according to the present inventive concept. In the illustrated embodiment shown in FIG. 7, in which the target state is P6, a memory cell having a state P5 is not selected when a precharge operation is performed.

Figure 8:
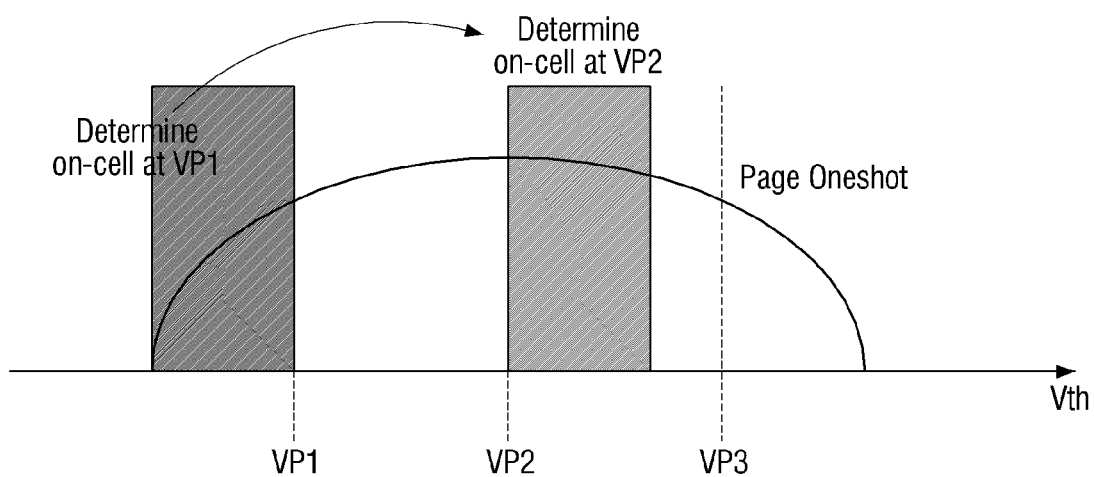
FIG. 8 illustrates cases of error occurrences during a verifying read operation.

FIG. 8 illustrates cases of error occurrences during a verifying read operation.

Referring to FIG. 8, errors are generated at unintendedly selected memory cells having different states. The errors may be generated at unintendedly selected memory cells having different states in a case where a memory cell is determined as an on-cell based on the verifying read operation performed at a corresponding verify voltage level and as an off-cell based on the verifying read operation performed at a higher verify voltage level.

According to the present inventive concept, since a verify voltage level of the target state is absolutely higher than verify voltage levels of different states of the unintendedly selected memory cells, if a minimum verify voltage level interval is greater than a random telegraph noise (RTN), a probability of errors occurring in the verifying read operation may be reduced.

Figure 9:
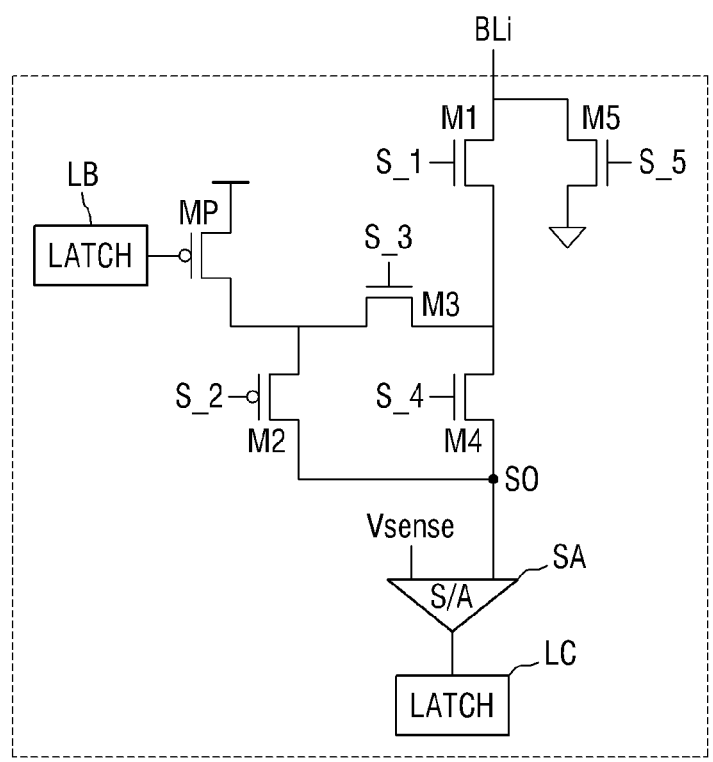
FIG. 9 is a circuit diagram illustrating a configuration of a page buffer according to another embodiment of the present inventive concept.

FIG. 9 is a circuit diagram illustrating a configuration of a page buffer according to another embodiment of the present inventive concept. For ease of explanation, the following description will focus on differences between the configurations of the page buffers shown in FIGS. 4 and 9.

Referring to FIG. 9, the page buffer 121' may include a precharge transistor MP for performing a precharge operation, a plurality of transistors M1 to M5 for performing a sensing operation, a sense amplifier SA for sensing a voltage of a sensing node, a first latch circuit LB for controlling the precharge transistor MP, and a second latch circuit LC for controlling the plurality of transistors M1 to M5.

Hereinafter, the operation of the page buffer 121' shown in FIG. 9 will be described. Like the page buffer shown in FIG. 4, the page buffer 121' shown in FIG. 9 is configured such that a circuit for controlling a precharge operation and a circuit for controlling a sensing operation are separate from each other.

In detail, the first latch circuit LB of the page buffer 121' having performed a program operation provides a low-level signal to continuously turn on the precharge transistor MP, and the sensing operation is controlled by the second latch circuit LC. The first latch circuit LB and the second latch circuit LC are comprised of different circuits. Therefore, during a verifying read period following after a bitline BLi is precharged once (without discharging the bitline BLi), precharge operations of additional bitlines BLi may be skipped. Accordingly, since a time taken in performing the verifying read operation is reduced, a time taken in performing the overall program operation may be reduced.

Figure 10:
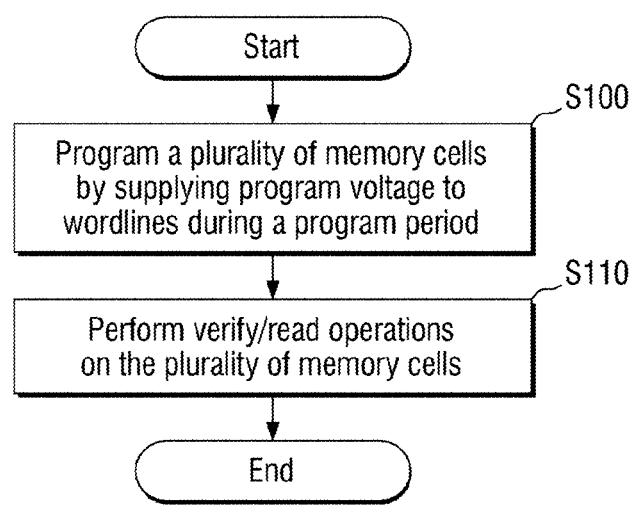
FIG. 10 is a flowchart sequentially illustrating an operating method of a non-volatile memory device according to an embodiment of the present inventive concept.

FIG. 10 is a flowchart sequentially illustrating an operating method of a non-volatile memory device according to an embodiment of the present inventive concept.

Referring to FIG. 10, first, the operating method of the non-volatile memory device according to an embodiment of the present inventive concept includes supplying a program voltage to wordlines during a program period and programming a plurality of memory cells to one of a plurality of logic states (S100).

In the present inventive concept, a memory cell including an MLC storing 4-bit data is exemplified (see FIG. 5). In the present inventive concept, the plurality of logic states may include E and P1 to P15.

Here, data are arranged and stored in the page buffer 120 such that the number of low level values (e.g., 0) among level values representing program states of the first memory cell (e.g., a memory cell having an upper state) is equal to or smaller than the number of low level values (e.g., 0) among level values representing program states of the second memory cell.

Next, a verify voltage is provided to wordlines during a verifying read period and a precharge voltage is supplied to bitlines, thereby performing verifying read operations on the plurality of memory cells (S110).

According to the present inventive concept, the verifying read operations are simultaneously performed on the first memory cell and the second memory cell, and the second memory cell may include some of the plurality of memory cells having lower states than the target state.

Figure 11:
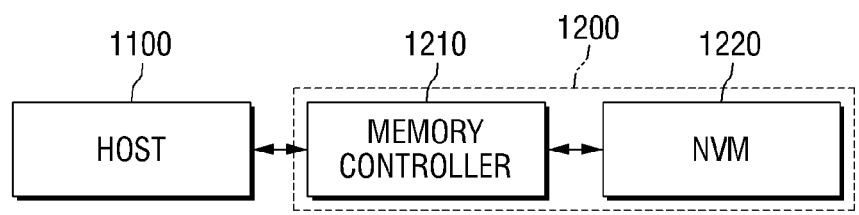
FIG. 11 is a block diagram illustrating a user device including non-volatile memory devices according to some embodiments of the present inventive concept.

FIG. 11 is a block diagram illustrating a user device including non-volatile memory devices according to some embodiments of the present inventive concept.

Referring to FIG. 11, the user device 1000 may include a host 1100 and a data storage device 1200.

The host 1100 may be configured to control the data storage device 1200. For example, the host 1100 may include a portable electronic device, such as a personal/portable computer, a personal digital assistant (PDA), a portable media player (PMP), or an MP3 player.

The host 1100 and the data storage device 1200 may be connected by a standardized interface such as USB, SCSI, ESDI, SATA, SAS, PClexpress, or IDE interface. However, the interfacing method for connecting the host 1100 and the data storage device 1200 is limited to those listed herein.

The data storage device 1200 may include a memory controller 1210 and a non-volatile memory device (NVM) 1220. The memory controller 1210 may control may control program/read/erase operations of the NVM 1220 in response to a request from the host 1100.

The NVM 1220 may include a plurality of non-volatile memory chips. The plurality of non-volatile memory chips may be configured or may operate in substantially the same manner as the non-volatile memory device according to some embodiments of the present inventive concept.

The data storage device 1200 may be configured by a solid state disk (SSD) device, which is, however, provided only for illustration by way of example. Rather, the data storage device 1200 may be configured by a personal computer memory card international association (PCMCIA), a compact flash card (CF), a smart media card (SM, SMC), a memory stick, a multi media card (MMC, RS-MMC, MMC-micro), a secure digital card (SD, miniSD, microSD), a Universal Flash storage (UFS), and the like, but not limited thereto.

Figure 12:
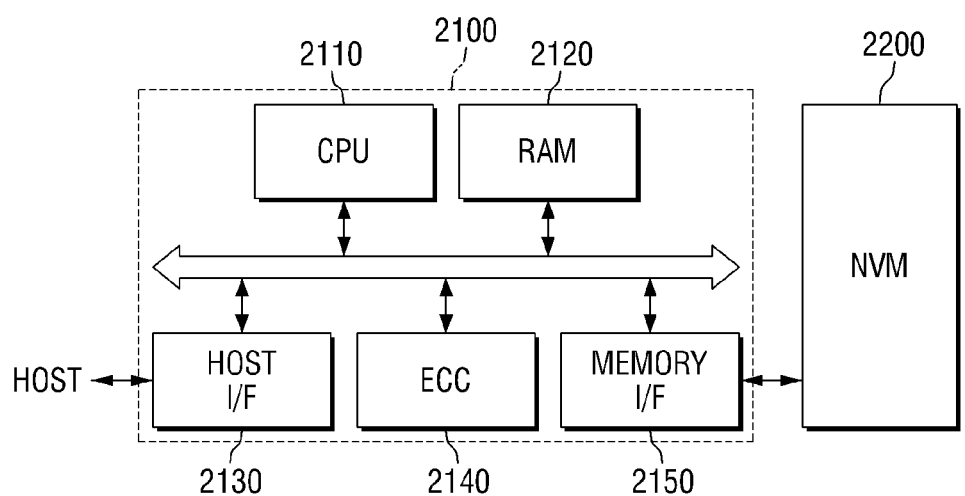
FIG. 12 is a block diagram for explaining an application example of a memory system including non-volatile memory devices according to some embodiments of the present inventive concept.

FIG. 12 is a block diagram for explaining an application example of a memory system including non-volatile memory devices according to some embodiments of the present inventive concept.

Referring to FIG. 12, the memory system 2000 may include a memory controller 2100 and a non-volatile memory device (NVM) 2200.

The memory controller 2100 may control program/read/erase operations of the NVM 2200 in response to a request from a host.

The memory controller 2100 may include a central processing unit (CPU) 2110, a random access memory (RAM) 2120, a host interface (UF) 2130, an error code correction (ECC) block 2140, and a memory interface (I/F) 2150.

The CPU 2110 may control the overall operation of the memory controller 2100.

The RAM 2120 may be used as a working memory of the CPU 2110. The host I/F 2130 may interface with the host connected to the memory system 2000 to exchange data.

The ECC 2140 may detect and correct an error of data read from the NVM 2200. The memory I/F 2150 may interface with the NVM 2200 to exchange data.

The NVM 2200 may include a plurality of non-volatile memory chips. The plurality of non-volatile memory chips may be configured or may operate in substantially the same manner as the non-volatile memory device according to some embodiments of the present inventive concept.

Figure 13:
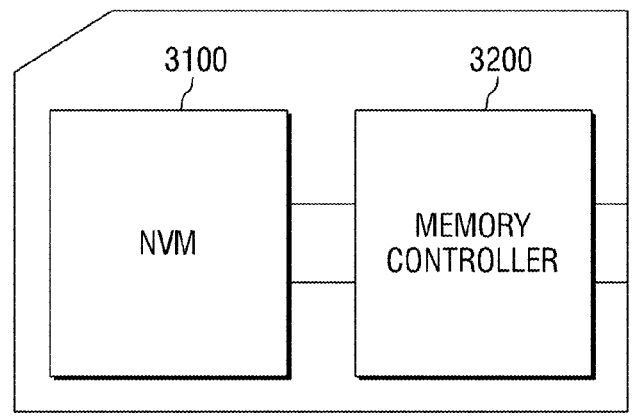
FIG. 13 is a block diagram illustrating a data storage device including non-volatile memory devices according to some embodiments of the present inventive concept.

FIG. 13 is a block diagram illustrating a data storage device including non-volatile memory devices according to some embodiments of the present inventive concept.

Referring to FIG. 13, the data storage device 3000 may include a non-volatile memory device (NVM) 3100 and a memory controller 3200.

The NVM 3100 may include a plurality of non-volatile memory chips. The plurality of non-volatile memory chips may be configured or may operate in substantially the same manner as the non-volatile memory device according to some embodiments of the present inventive concept.

The memory controller 3200 may control program/read/erase operations of the NVM 3100 in response to an externally applied request.

The data storage device 3000 may configure a memory card device, an SSD device, a multimedia card device, an SD device, a memory stick device, a hard disk drive device, a hybrid drive device, or a general-purpose serial bus flash device. For example, the data storage device 3000 may configure a card for using a user device, such as a digital camera, or a personal computer.

Figure 14:
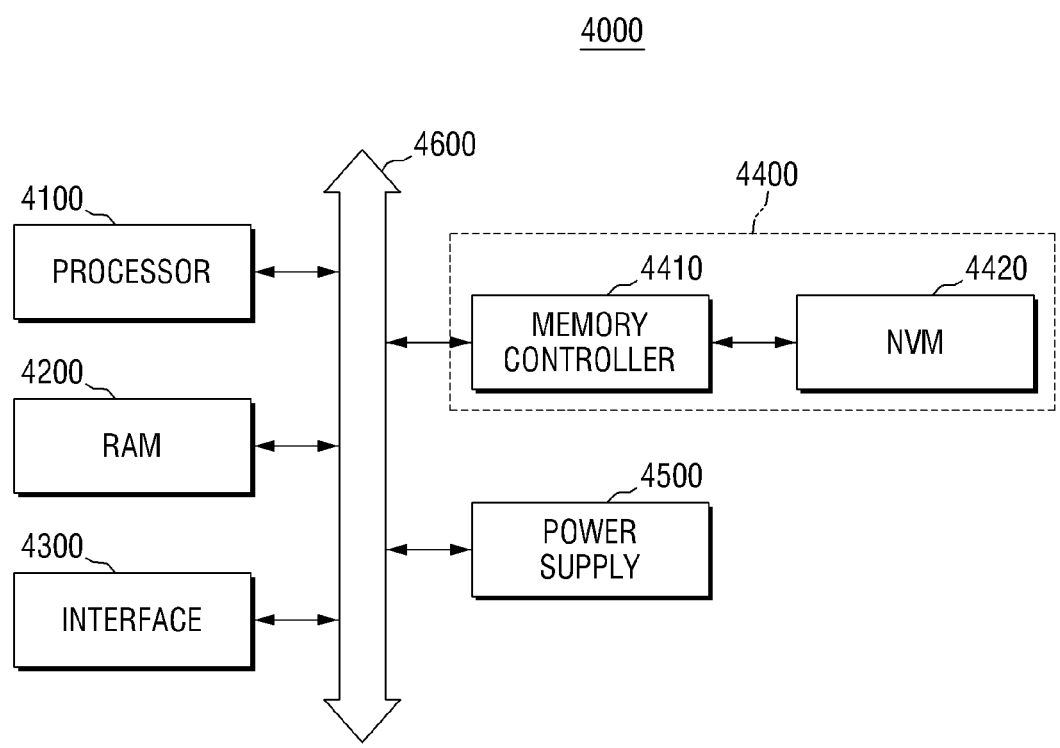
FIG. 14 is a block diagram for explaining a computing system including non-volatile memory devices according to some embodiments of the present inventive concept.

FIG. 14 is a block diagram for explaining a computing system including non-volatile memory devices according to some embodiments of the present inventive concept.

Referring to FIG. 14, the computing system 4000 may include a processor 4100, a random access memory (RAM) 4200, an interface 4300, a memory system 4400, a power supply 4500 and a bus 4600.

The processor 4100, the random access memory (RAM) 4200, the interface 4300, the memory system 4400, and the power supply 4500 may be connected to each other through the bus 4600. The bus 4600 corresponds to a path through which data moves.

The processor 4100 may include at least one of a microprocessor, a digital signal processor, a microcontroller, and logic elements capable of functions similar to those of these elements.

The RAM 4200 may be used as a working memory for improving the performance of the processor 4100. The interface 4300 may perform functions of transmitting data to a communication network or receiving data from the communication network.

The interface 4300 may be wired or wireless. For example, the interface 4300 may include an antenna or a wired/wireless transceiver, and so on.

The memory system 4400 may store data and/or commands. The memory system 4400 may include a memory controller 4410 and a non-volatile memory (NVM) 4420.

The memory controller 4410 may control program/read/erase operation of the NVM 4420. The NVM 4420 may include a plurality of non-volatile memory chips. The plurality of non-volatile memory chips may be configured and may operate in substantially the same manner with the non-volatile memory devices according to some embodiments of the present inventive concept.

The power supply 4500 may supply power required to operate the processor 4100, the RAM 4200, the interface 4300 and the memory system 4400.

The computing system 4000 may be applied to a personal digital assistant (PDA), a portable computer, a web tablet, a wireless phone, a mobile phone, a digital music player, a memory card, or any type of electronic device capable of transmitting and/or receiving information in a wireless environment.

The steps of the method or algorithm described above in connection with the embodiments of the present inventive concept may be embodied directly in hardware, in a software module executed by a processor, or in a combination of the two. A software module may reside in a random access memory (RAM), a flash memory, a read-only memory (ROM), an erasable programmable read-only memory (EPROM), an electrically erasable programmable read-only memory (EEPROM), a register, a hard disk, a removable disk, a compact disk read-only memory (CD-ROM), or any other form of storage medium known in the art. An exemplary storage medium may be coupled to the processor, such that the processor can read information from, and write information to, the storage medium. Alternatively, the storage medium may be integral to the processor. Further, in some aspects, the processor and the storage medium may reside in an ASIC. Additionally, the ASIC may reside in a user terminal. The processor and the storage medium may reside as discrete components in a user terminal.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A non-volatile memory device comprising:
a memory cell array having a plurality of memory cells programmable into one of multiple logic states, the plurality of memory cells disposed at intersections of a plurality of wordlines and a plurality of bitlines; and
a plurality of page buffers respectively connected to the plurality of bitlines and performing verifying read operations on the plurality of memory cells,
wherein the verifying read operations are performed on a first memory cell having a target state and a second memory cell having a lower state than the target state, and
wherein the page buffers include a first latch circuit controlling a precharge operation of supplying the precharge voltage to the bitlines.

2. The non-volatile memory device of claim 1, wherein the verifying read operations are performed on a plurality of second memory cells having lower states than the target state.

3. The non-volatile memory device of claim 1, wherein the plurality of page buffers simultaneously perform the verifying read operations on the first and second memory cells.

4. The non-volatile memory device of claim 3, wherein the second memory cell is a memory cell determined as an on-cell based on a result of the verifying read operation performed at a corresponding verify voltage level.

5. The non-volatile memory device of claim 1, wherein the target state and the lower state are non-contiguous states.

6. The non-volatile memory device of claim 1, wherein the page buffers include a precharge circuit comprising the first latch circuit and performing the precharge operation, and a second latch circuit controlling a sensing operation of sensing a voltage of a sensing node connected to the bitlines, and the precharge circuit is controlled to supply the precharge voltage to the bitlines irrespective of program states of the memory cells disposed in the bitlines.

7. The non-volatile memory device of claim 6, wherein the precharge circuit performs the precharge operation to supply the precharge voltage to the first and second memory cells.

8. The non-volatile memory device of claim 7, wherein the second memory cell is a memory cell determined as an on-cell based on a result of the verifying read operation performed at a corresponding verify voltage level.

9. The non-volatile memory device of claim 6, wherein the second memory cell is a memory cell determined as an on-cell as a result of performing the verifying read operation on a corresponding verify voltage level and the second latch circuit controls to perform the sensing operation on the first and second memory cells.

10. The non-volatile memory device of claim 1, wherein the page buffers further include a second latch circuit controlling a sensing operation of sensing a voltage of a sensing node connected to the bitlines, and the first latch circuit and the second latch circuit are different from each other.

11. A non-volatile memory device comprising:
a memory cell array having a plurality of memory cells programmable into one of multiple logic states, the plurality of memory cells disposed at intersections of a plurality of wordlines and a plurality of bitlines; and
a plurality of page buffers respectively connected to the plurality of bitlines and performing verifying read operations on the plurality of memory cells, and one of the plurality of page buffers includes a precharge transistor performing a precharge operation, a plurality of transistors performing sensing operations, a sense amplifier sensing a voltage of a sensing node, and a latch circuit controlling the plurality of transistors,
wherein the plurality of page buffers arrange and memorize data in the page buffers such that a number of low level values among level values representing program states of one among the plurality of memory cells is equal to or smaller than a number of low level values among level values representing program states of another among the plurality of memory cells.

12. The non-volatile memory device of claim 11, wherein the verifying read operations are performed on a first memory cell having a target state and a second memory cell having a lower state than the target state.

13. The non-volatile memory device of claim 12, wherein the verifying read operations are performed on a plurality of second memory cells having lower states than the target state.

14. The non-volatile memory device of claim 13, wherein the plurality of page buffers simultaneously perform the verifying read operations on the first and second memory cells.

15. The non-volatile memory device of claim 14, wherein the second memory cell is a memory cell determined as an on-cell based on a result of the verifying read operation performed at a corresponding verify voltage level.

16. An operating method for a non-volatile memory device comprising:
supplying a program voltage to wordlines during a program period to program a plurality of memory cells to one of a plurality of logic states;
performing verifying read operations on the plurality of memory cells with a verify voltage provided to the wordlines during a verifying read period and a precharge voltage supplied to bitlines,
wherein the verifying read operations are performed on a first memory cell having a target state and a second memory cell having lower states than the target state; and
rearranging and memorizing data in page buffers such that a number of low level values among level values representing program states of the first memory cell is equal to or smaller than a number of low level values among level values representing program states of the second memory cell.

17. The method of claim 16, the verifying read operations are simultaneously performed on the first memory cell and the second memory cell.

18. The method of claim 17, wherein said verifying read operations are performed on a plurality of second memory cells having lower states than the target state.

19. The method of claim 18, wherein the second memory cell is a memory cell determined as an on-cell based on a result of the verifying read operation performed at a corresponding verify voltage level.

* * * * *